United States Patent [19]

Ghanbari

[11] Patent Number: 4,778,561

[45] Date of Patent: Oct. 18, 1988

[54] ELECTRON CYCLOTRON RESONANCE PLASMA SOURCE

[75] Inventor: Ebrahim Ghanbari, Huntington, N.Y.

[73] Assignee: Veeco Instruments, Inc., Melville, N.Y.

[21] Appl. No.: 115,433

[22] Filed: Oct. 30, 1987

[51] Int. Cl.[4] .......................... B44C 1/22; B05B 5/02; C23C 14/00; C03C 15/00

[52] U.S. Cl. .................................. 156/643; 118/728; 118/50.1; 118/623; 156/646; 156/345; 204/192.1; 204/298; 427/38; 250/423 R; 250/424

[58] Field of Search .................. 156/643, 646, 345; 427/38, 39; 118/715, 719, 724, 728, 733, 50.1, 620, 621, 623, 624; 204/192.1, 192.11, 192.12, 192.32, 192.34, 298; 250/423 R, 424; 376/121, 144; 331/86; 313/153, 156, 157, 161, 162, 231.31, 359.1, 362.1, 363.1; 314/113, 120; 315/111.21, 111.31, 111.41, 111.61, 111.71, 111.81, 111.91, 344; 219/121 PD, 121 PE, 121 PG, 121 PT, 121 PU, 121 PY

[56] References Cited

U.S. PATENT DOCUMENTS

| | | | |
|---|---|---|---|
| 3,212,974 | 10/1965 | Leboutet et al. | 176/5 |
| 3,291,715 | 12/1966 | Anderson | 204/298 |
| 3,330,752 | 7/1967 | Hallen et al. | 204/192 |
| 3,375,452 | 3/1968 | Forsyth | 328/235 |
| 3,390,293 | 6/1968 | Nunan | 313/63 |
| 3,418,206 | 12/1968 | Hall et al. | 176/2 |
| 3,431,461 | 3/1969 | Dodo et al. | 315/39 |
| 3,528,387 | 9/1970 | Hamilton | 118/49.1 |
| 3,552,124 | 1/1971 | Banks et al. | 60/202 |
| 3,708,418 | 1/1973 | Quinn | 204/298 |
| 3,744,247 | 7/1973 | Margosian et al. | 60/202 |
| 3,778,656 | 12/1973 | Fremiot et al. | 313/63 |
| 3,824,388 | 7/1974 | Boom | 250/325 |
| 3,916,034 | 10/1975 | Tsuchimoto | 427/38 |
| 3,937,917 | 2/1976 | Consoli | 219/121 P |
| 4,045,677 | 8/1977 | Humphries, Jr. et al. | 250/423 R |
| 4,058,748 | 11/1977 | Sakudo et al. | 313/156 |
| 4,065,369 | 12/1977 | Ogawa et al. | 204/164 |

(List continued on next page.)

OTHER PUBLICATIONS

M. Miyamura, O. Tsukakoshi and S. Komiya, "A 26 cm Electron-Cyclotron-Resonance Ion Source for Reactive Ion Beam Etching of $SiO_2Si$", *Journal of Vacuum Science Technology*, vol. 20, No. 4, Apr. 1982.

Tsutomu Tsukada; "Reactive Ion Beam ECR Sources as Used in VLSI Manufacture".

Yukio Okamoto and Hajime Tamagawa, "Some Features of an Electron Cyclotron Resonance Plasma Produced by Means of a Lisitano-Coil", *Japanese Journal of Applied Physics*; vol. 11, No. 5, May 1972.

J. F. Decker and C. V. D'Amico, "Cyclotron Resonance Plasma Source with Variable Temperature and Density Profiles", *The Review of Scientific Instruments*; vol. 41, No. 10, Oct. 1970.

List continued on next page.

*Primary Examiner*—William A. Powell
*Attorney, Agent, or Firm*—Morgan & Finnegan

[57] ABSTRACT

An electron cyclotron resonance (ECR) plasma source for generating a plasma for etching, deposition, predeposition and material property modification processes. The plasma source includes two magnetic field sources. The first magnetic field source provides a magnetic field of sufficient intensity to achieve an ECR condition for a given microwave frequency input beam. The second magnetic field source enhances the uniformity of the plasma formed and the uniformity of the output by creating a uniform field region in the plasma generating chamber. The second magnetic field source also reduces the magnetic field so that the plasma near the extraction system and the output extracted are less magnetized. The magnetic field intensity, longitudinal position, radial position and pole orientation are design variables for adjusting the second magnetic field source to enhance uniformity and reduce the magnetization of the output.

The ECR plasma source also includes a window apparatus which electrically isolates the plasma generating chamber which is at a high potential from the microwave source near ground potential. The window apparatus is cooled and also serves as a pressure isolator between the plasma generating chamber which is at vacuum pressure and the microwave source which is at atmospheric pressure.

24 Claims, 7 Drawing Sheets

U.S. PATENT DOCUMENTS

| | | | |
|---|---|---|---|
| 4,123,316 | 10/1978 | Tsuchimoto | 156/643 |
| 4,233,109 | 11/1980 | Nishizawa | 156/643 |
| 4,287,419 | 9/1981 | Booth | 250/396 ML |
| 4,293,794 | 10/1981 | Kapetanakos | 315/111.81 |
| 4,303,865 | 12/1981 | Swingler | 250/423 |
| 4,316,090 | 2/1982 | Sakudo et al. | 250/423 |
| 4,356,073 | 10/1982 | McKelvey | 204/192 R |
| 4,393,333 | 7/1983 | Sakudo et al. | 315/111.81 |
| 4,401,054 | 8/1983 | Matsuo et al. | 118/723 |
| 4,409,520 | 10/1983 | Koike et al. | 315/39 |
| 4,417,178 | 11/1983 | Geller et al. | 315/111.81 |
| 4,438,368 | 3/1984 | Abe et al. | 315/39 |
| 4,450,031 | 5/1984 | Ono et al. | 156/345 |
| 4,491,735 | 1/1985 | Smith | 250/423 R |
| 4,492,620 | 1/1985 | Matsuo et al. | 204/192 R |
| 4,516,050 | 5/1985 | Russo | 313/359.1 |
| 4,529,571 | 7/1985 | Bacon et al. | 376/144 |
| 4,543,465 | 9/1985 | Sakudo et al. | 219/121 PD |
| 4,553,256 | 11/1985 | Moses | 378/137 |
| 4,554,484 | 11/1985 | Read et al. | 315/4 |
| 4,580,120 | 4/1986 | Jacquot | 335/301 |
| 4,581,100 | 4/1986 | Hatzakis et al. | 156/643 |
| 4,585,668 | 4/1986 | Asmussen et al. | 427/38 |
| 4,598,231 | 7/1986 | Matsuda | 315/111.81 |
| 4,609,428 | 9/1986 | Fujimara | 156/643 |
| 4,611,121 | 9/1986 | Miyamura et al. | 250/423 R |
| 4,630,566 | 12/1986 | Asmussen et al. | 118/50.1 |
| 4,631,438 | 12/1986 | Jacquot | 313/359.1 |
| 4,636,688 | 1/1987 | Ito | 315/4 |
| 4,638,209 | 1/1987 | Asamaki et al. | 313/359.1 |
| 4,638,216 | 1/1987 | Delauney et al. | 315/111.81 |
| 4,642,571 | 2/1987 | Minami et al. | 328/59 |
| 4,659,899 | 4/1987 | Welkie et al. | 219/121 PN |
| 4,661,783 | 4/1987 | Gover et al. | 331/82 |
| 4,664,747 | 5/1987 | Sekiguci et al. | 156/643 |

OTHER PUBLICATIONS

P. A. Tulle, "Off-Resonance Microwave-Created Plasmas"; *Plasma Physics*, vol. 15, pp. 971–976; 1973.

V. Kopecky, J. Musil and F. Zacek, "*Absorption of Microwave Energy in a Plasma Column at High Magnetic Fields*"; vol. 50A, No. 4, Dec. 16, 1974.

J. Musil, F. Zacek, "Effect of the Polarization of the Electromagnetic Wave on Wave Energy Absorption Caused by the Linear Transformation of Waves", *Czech Journal of Physics*, B 22 (1972).

J. Musil, F. Zacek, "Anomalous Absorption of Intense Electromagnetic Waves in a Plasma at High Magnetic Fields"; *Plasma Physics*, vol. 16, pp. 735–739 (1974).

Yukio Okamoto and Hajime Tamagawa, "Production of Large Area High Current Ion Beams", *The Review of Scientific Instruments*, vol. 43, No. 8, Aug. 1972.

N. Sakudo, K. Tokiguchi, H. Koike, I. Kanomata, "Microwave Ion Source", Review of Scientific Instruments, vol. 48, No. 7, Jul. 1977.

R. Geller, "Electron Cyclotron Resonance Multiply Charge Ion Sources", *IEEE Transactions on Nuclear Science*, vol. NS-23, No. 2, Apr. 1976.

George R. Brewer, *Ion Propulsion Technology and Applications*, Gordon and Breach, Science Publishers, Inc. pp. 184–249; 1970.

ECR 2000R product brochure by Plasma Technology—discloses ECR Etching System.

ECR 3000R product brochure by Plasma Technology—discloses ECR Deposition System.

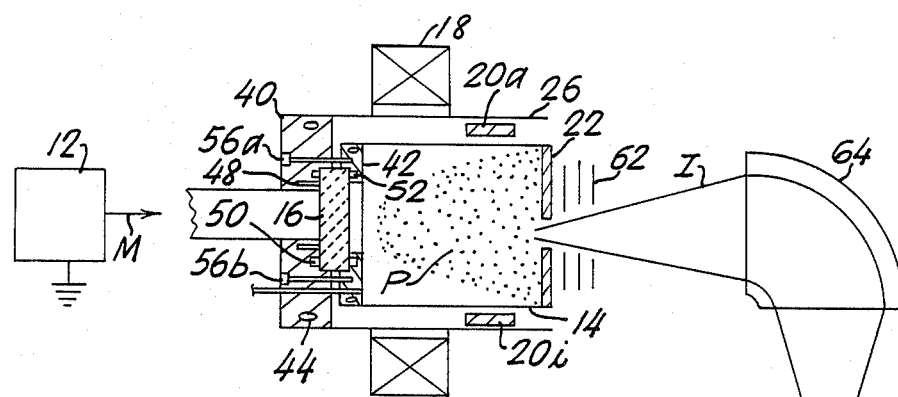
FIG. 8
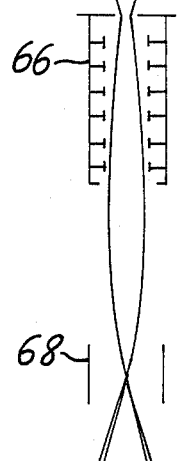
FIG. 6
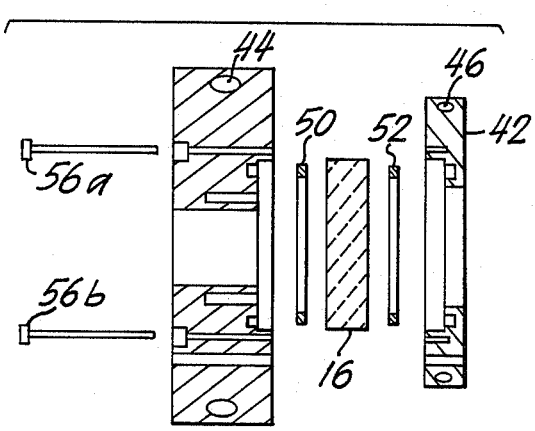

ELECTRON CYCLOTRON RESONANCE PLASMA SOURCE

FIELD OF THE INVENTION

The present invention relates to an electron cyclotron resonance (ECR) plasma source. More particularly, the present invention relates to an ECR plasma source to generate a plasma for etching processes and deposition processes, as well as pre-deposition surface processes and material property dification processes.

BACKGROUND OF THE INVENTION

Electron cyclotron resonance (ECR) relates to the circular motion of free electrons orbiting about magnetic field lines while absorbing microwave energy. When the orbital frequency of the electrons in the magnetic field is equal to the frequency of the microwaves, resonance occurs and the electrons gain energy. The ECR frequency, $f_{ECR}$, is:

$$f_{ECR} = \frac{1}{(2pi)} \frac{eB}{m_e c} = (2.80 \times 10^6) B \text{ in Hz}.$$

where:
e = electron charge
$m_e$ = mass of an electron
c = speed of light
B = magnetic field strength in Gauss.
pi = constant, pi, 22/7.

For a given microwave frequency, $f_m$, ECR will occur at a specific magnetic field strength which satisfies the equation:

$$f_m = f_{ECR} = (2.80 \times 10^6) B \text{ H}_z$$

To form a plasma with an ECR source, gas is introduced into a low pressure plasma generating chamber. A magnetic field is applied at the chamber to cause cyclatron motion of the electrons in the gas. By creating an ECR condition with the microwave beam and magnetic field, the electrons gain energy through resonant absorption and collide with the background gas causing further ionization. The result is a plasma consisting of electrons, ions, free radicals, and neutral atoms.

By continually pumping microwave energy into the chamber, the gyrating electrons are "hotter" (i.e. more energetic) than electrons generated with "hot filament" ion sources. This enables the ECR plasma source to continue to create ions and provides a high ionization efficiency which is significantly greater than that of typical arc and cathode discharge plasma ion sources.

One problem with using ECR to generate a plasma is the difficulty of achieving a uniform population distribution of the ions throughout the plasma (i.e. uniform ion density). By using only an electromagnetic coil to create the magnetic field the ion density is more concentrated at the center of the plasma, where the magnetic field is strongest, than at the edges, where the magnetic field is weaker. The effect of such a nonuniform distribution is that the plasma or ion beam extracted will also have a nonuniform ion density. A uniform ion density is desirable for etching, deposition, pre-deposition and material property modification processes.

An object of the invention is to provide a magnetic field configuration for achieving a uniform ion density.

Another object of this invention is to provide a magnetic field configuration which enhances the coupling of microwave energy and magnetic field strength to optimize the power transfer to the free electrons in a plasma.

In applications which generate an ion beam between 20 and 2000 Electron-Volts, the plasma generating chamber will be subject to a high potential.

Another object of this invention is to provide a voltage isolator between the microwave source and the plasma generating chamber so that the microwave source may operate at or near ground potential while the plasma generating chamber may operate at a high potential.

Another object of this invention is to provide a voltage isolator, pressure isolator, microwave choke, and cooling apparatus in a single window apparatus.

SUMMARY OF THE INVENTION

The present invention relates to a magnetic field configuration which provides a uniform reduced field region near the extraction system. As a result of the uniform field the ion density will be uniform in the same region. By placing the uniform field near the extraction system the output extracted through the extraction system also will be uniform. The magnetic field configuration is created from two magnetic field sources. The first magnetic field source creates a magnetic field in the plasma generating chamber which in combination with the microwave energy causes an ECR condition and ionization of gas molecules to form a plasma of ions, electrons, free radicals, and neutral atoms. The second magnetic field source, which has a significantly lower magnetic field intensity than that of the first magnetic field source, creates the uniform field region within the plasma generating chamber.

The second magnetic field source creates a magnetic field which is strongest at the periphery of the plasma generating chamber and decreases radially toward the axis of the plasma generating chamber. The first magnetic field source creates a magnetic field which is strongest at the axis of the plasma formation chamber and decreases radially toward the periphery of the plasma formation chamber. The second magnetic field, thus, increases the field at the periphery of the chamber where the first magnetic field is weakest and has little effect at the axis where the magnetic field due to the first source is strongest. The net magnetic field from the two magnetic field sources in the plane of the second magnetic field source is a more uniform magnetic field in such plane.

The more uniform magnetic field causes a more uniformly distributed population of ions. As the plasma moves out of the plane of the second magnetic field source toward the extraction system the plasma fans out due to a decrease in magnetic field intensity along the axis of the plasma generating chamber. Ideally the magnetic field is minimal for ion beam extraction at the extraction grids so that the plasma is unmagnetized.

By placing the second magnetic field source near the extraction system, the output extracted (i.e. ion beam; plasma stream) becomes more uniform. The second magnetic field source is, in effect, a source for tuning the efficiency of the ECR source to produce a uniform less magnetized, ideally unmagnetized plasma at the extraction system. The position, intensity, and polarity of the second magnetic field source are variables which may be pre-adjusted by design to optimize the magnetic field configuration and efficiency of the plasma source.

The increased efficiency means that the plasma density is higher for a given pressure. Thus, the source can operate with high output densities at lower pressures and a lower gas flow.

The present invention also relates to a high voltage isolator for electrically isolating the plasma generating chamber from the microwave source. The plasma generating chamber achieves a high potential as a result of the plasma formation. Because the Microwave source does not need to operate at the same high potential as the plasma generating chamber, the voltage isolator enables the microwave source to operate at or near ground potential. In the preferred embodiment, the isolator is a window apparatus including two (2) spaced apart barriers connected by a nonconductive window. The spacing is a distance far enough to prevent a voltage jump between the two barriers.

The window apparatus, also provides a number of additional functions. The window apparatus is water cooled to reduce the heat that builds up at the window from (1) the high power microwave energy passing through the window and (2) the high voltage potential created at the adjacent plasma generating chamber. The window apparatus also includes a microwave choke which reduces the microwave leakage. Lastly, the window apparatus includes vacuum seals which enable the plasma generating chamber to operate at a vacuum pressure (i.e. in the order of $10^{-3}$ Torr and $10^{-4}$ Torr) while the microwave source operates at or near atmospheric pressure. In the preferred embodiment the vacuum seals are metal, thus being compatible with the reactive gases used in RIE (Reactive Ion Etching), RIBE (Reactive Ion Beam Etching), CAIBE (Chemically Assisted Ion Beam Etching) and RISE (Reactive Ion Stream Etching) applications.

The window apparatus thus incorporates five features: (1) voltage isolation, (2) pressure isolation, (3) water cooling, (4) microwave choke and (5) metal vacuum seals compatible with reactive gases.

BRIEF DESCRIPTION OF THE DRAWINGS

FIG. 6 is an exploded view of the water cooled window apparatus.

FIG. 8 is a cutaway view of the ECR plasma source configured for ion implantation.

DETAILED DESCRIPTION OF THE INVENTION

Figure 1:
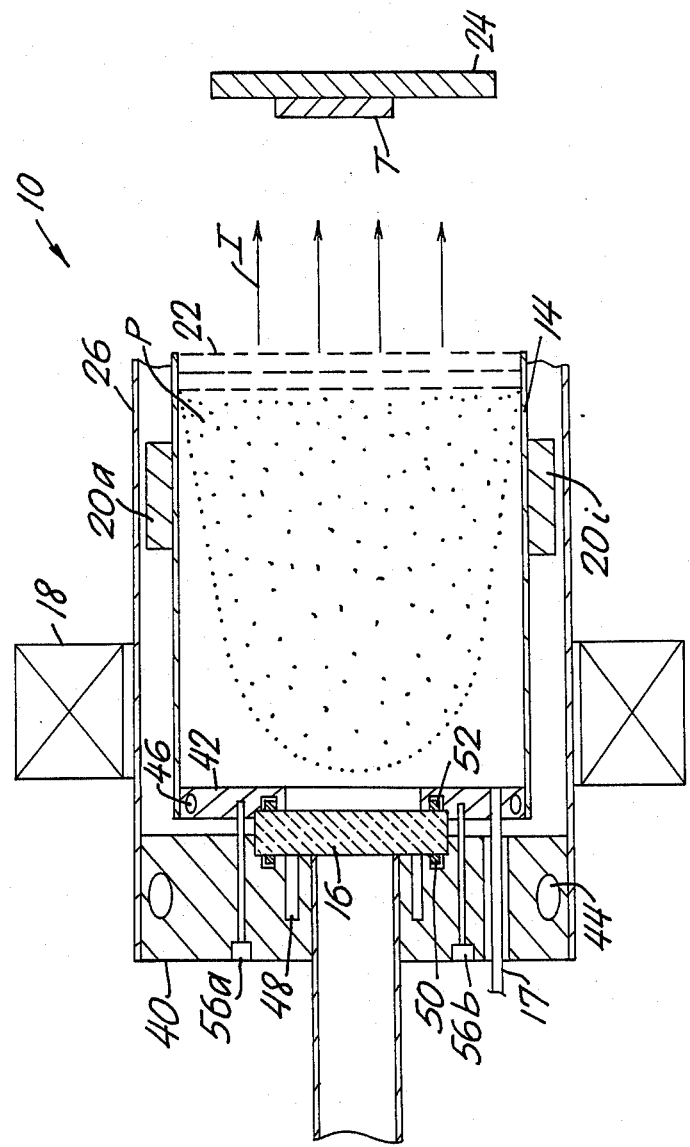
FIG. 1 is a cutaway view of the ECR plasma source configured as an ion beam source and showing the microwave source in block diagram format.
Figure 1:
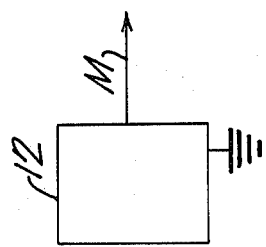

FIG. 1 shows a preferred embodiment of the ECR source 10 configured to emit an Ion beam, I, onto a target, T. A microwave beam, M, emitted from a Microwave source 12 enters a plasma generating chamber 14 through a window 16. The plasma generating chamber 14 is shaped as a cylinder as shown in the partial sectional view of FIG. 2, although other shapes may be utilized.

Gas is introduced into the chamber 14 at channel 17. The gas is ionized by the microwave energy of beam M coupled with the magnetic field energy of a magnetic field formed by a first magnetic field source 18. The first magnetic field source 18 is an electromagnetic coil which forms a band around the plasma generating chamber 14. The coil 18 can be moved longitudinally along the axis of chamber 14 to adjust the axial location of the maximum point of the magnetic field. The maximum point occurs along the axis of the chamber at the midpoint of the coil 18. Other magnetic field sources capable of generating a sufficient magnetic field strength to achieve an ECR condition also may be used. The magnetic field causes the electrons to orbit along the magnetic field lines while the Microwave beam energizes the electrons as the electrons orbit. The coupling of the microwave beam and magnetic field causes the gas to form a plasma of electrons, ions, free radicals, and neutral atoms.

The efficiency of energy transfer to the electrons is enhanced by operating under an Electron Cyclotron Resonance (ECR) condition. The ECR condition occurs when the frequency of the microwave beam, $f_m = (2.80 \times 10^6)B$, where B is the magnetic field strength in Gauss. Thus, for a typical 2.45 GHZ microwave frequency the magnetic field strength applied by the first magnetic field source 18 to achieve ECR is approximately 875 Gauss.

An output is extracted from the generating chamber 14 with the extraction system 22. The output and the extraction system may vary depending on the application. FIG. 1 depicts an ECR plasma source configured for ion beam extraction. The ion beam, I, strikes a target, T, on a target support 24. The ion beam, I, is extracted by grids 22 typically made of molybdenum and high density graphite, although the grids may be made of any conductive material that can withstand the temperature extremes of chamber 14 and have proper mechanical characteristics to avoid buckling. Typically chamber 14 will undergo a temperature change from room temperature up to 500° C. to 1,000° C. The molybdenum and graphite grids can tolerate temperatures up to 2,000° C. to 3,000° C.

The plasma formed by the electromagnetic coils 18 typically concentrates ions at the center of the plasma generating chamber 14 in the plane of the coils 18. This is where the magnetic field from the coils is strongest. The plasma, if subject only to the magnetic field of the coils, would be nonuniform.

To provide an area of uniform plasma a second magnetic field source 20 is provided at the periphery of the plasma generating chamber between the first magnetic field source 18 and the extraction system 22. The second magnetic field source 20 provides a uniform field region in the plasma generating chamber. The uniform field region occurs at the plane defined by the second magnetic field source 20. By adjusting the second field to provide a uniform field region, a more uniform plasma can be achieved. As the uniform plasma moves toward the extraction system, the plasma fans out. As a result, the plasma will be nonuniform toward the microwave introducing window 16 and generally increase in uniformity toward the extraction system to provide a uniform output (i.e. ion beam, plasma stream).

For ion beam extraction it is also desireable that the magnetic field at the extraction system be minimal so that the plasma and the ion beam output will be less magnetized and preferably unmagnetized. The configuration of the second magnetic field source also is for reducing the net magnetic field to reduce the magnetization of the plasma.

Figure 2:
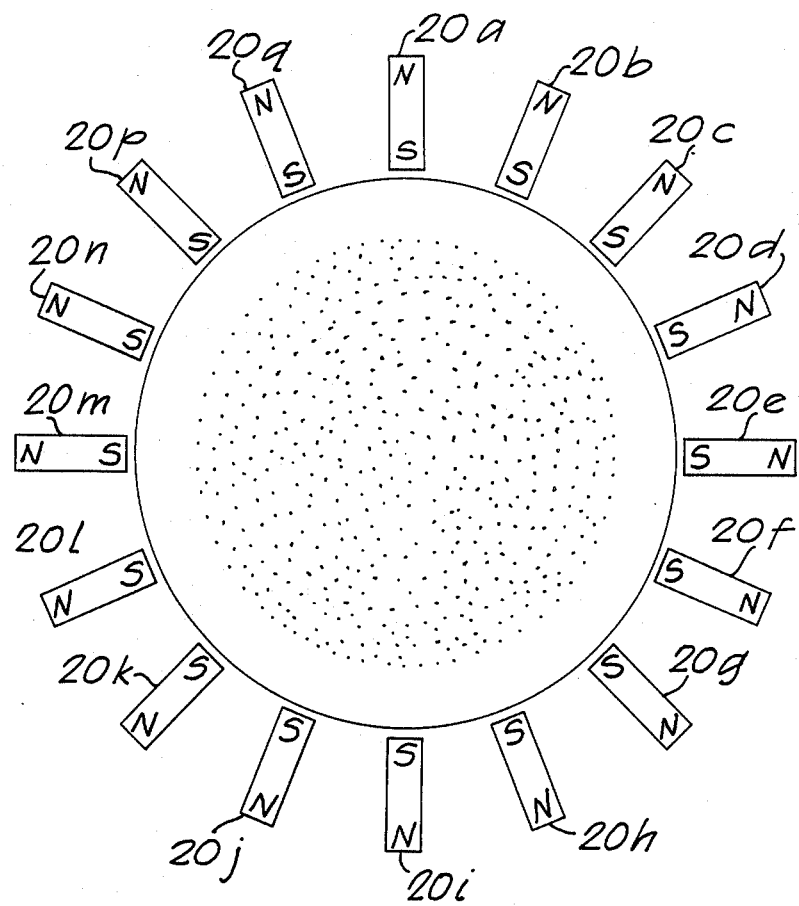
FIG. 2 is a sectional view of the plasma generating chamber having permanent magnets radially aligned at the periphery.

In the embodiment of FIGS. 1 and 2 the second magnetic circuit is made up of a group of permanent magnets. Sixteen permanent magnets 20a–20q are illustrated in FIG. 2 although the number may vary. Although illustrated as permanent magnets 20a–20q, the second magnetic field source 20 may be any other magnetic field sources for providing a uniform and reduced field region without disrupting the ECR condition in chamber 14.

Figure 3:
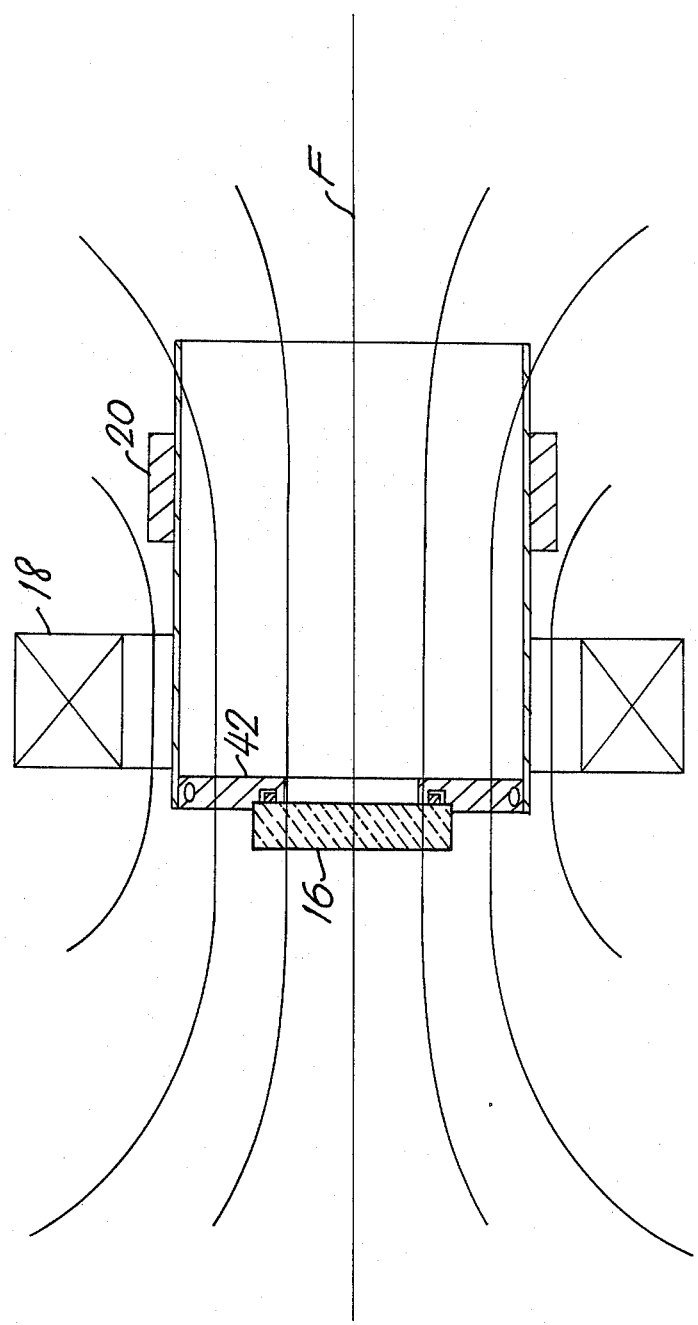
FIG. 3 is a cutaway view of the plasma generating chamber showing the magnetic flux lines of the magnetic coil.

The field strength of the first magnetic field source 18 is selected to achieve an ECR condition. FIG. 3 illustrates the magnetic flux density produced from coils 18. The flux density is shown to be highest at the midpoint of the coil along the axis of the chamber 14 as depicted by the spacing of the flux lines, F. The flux density decreases along the axis away from the midpoint of the coil 18.

Figure 4:
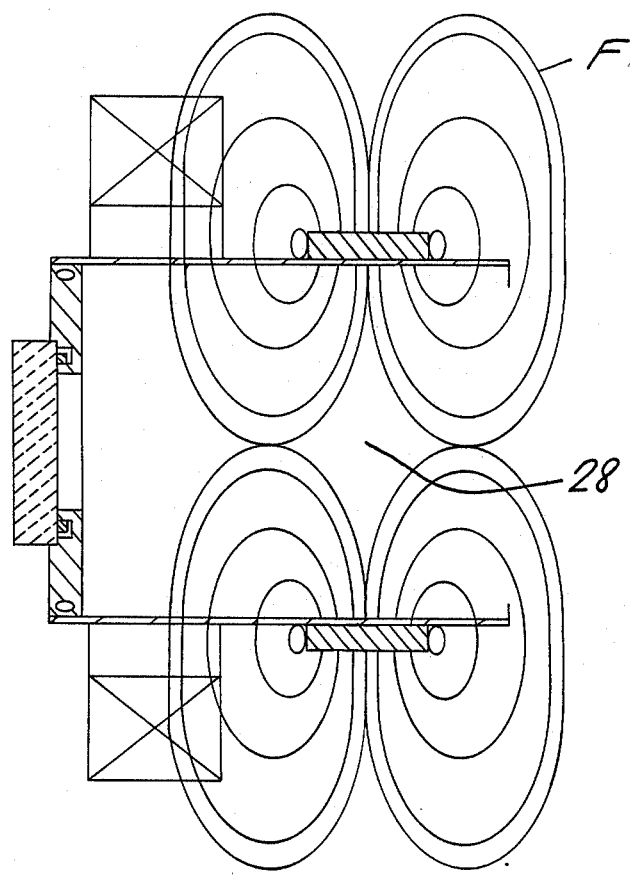
FIG. 4 is a cutaway view of the plasma generating chamber showing the magnetic flux lines of the permanent magnets.
Figure 5:
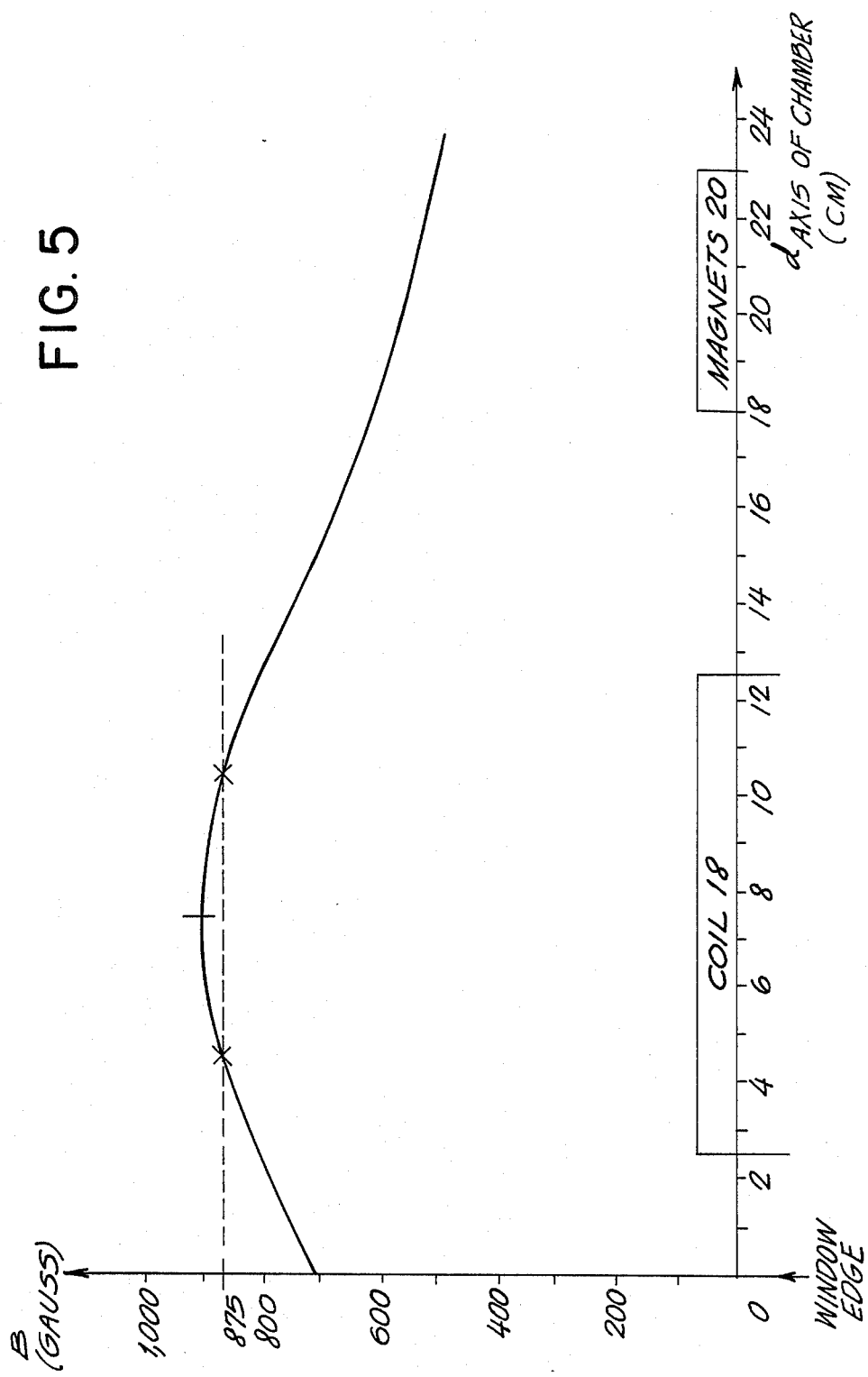
FIG. 5 is a chart of the magnetic field intensity along the central axis of the plasma generating chamber.

The field strength and position of the second magnetic field source 20 is selected to tune the source 10. For ion extraction the objective is to achieve a uniform and unmagnetized (or less magnetized) ion beam output. For plasma extraction the objective is to achieve a uniform plasma stream output. Ideally, the field strength of the permanent magnets at the walls of chamber 14 should equal the difference between the field strength of the coils 18 at the axis and the field strength of the coils 18 at the wall of the chamber 14 in the plane of the second magnetic field source. FIG. 4 illustrates the magnetic flux density produced from the permanent magnets 20. The numeral 28 designates a reduced field region where magnetic fields from the permanent magnets nearly or optimally cancel out. As shown in FIG. 5 the magnetic field intensity at the center of the chamber 14 results primarily from the magnetic field of the first magnetic field source 18. The magnetic field intensity along the axis decreases away from the coil 18. In the radial direction (not shown) the magnetic field from the first magnetic source decreases from the central axis toward the chamber 14 walls.

The permanent magnets 20 a–q provide a magnetic field which is strongest at the periphery of the chamber 14 and decreases toward the axis of the chamber. Note that the coils 18 provide a field which is strongest at the axis of the chamber and decreases toward the periphery of the chamber. The combined effect of the two magnetic fields in the plane of the permanent magnets 20 is a more uniform magnetic field. A more uniform magnetic field results in a more uniformly distributed population of ions (ion density) in the plane of the magnets 20. This plane is located near the extraction system. As the plasma moves out of the plane toward the extraction system 22, the plasma fans out due to the decrease in magnetic field intensity along the axis of chamber 14. The resulting shape of the plasma from the first and second magnetic field sources 18, 20 is shown generally in FIG. 1.

In the plane of the first magnetic field source 18 the plasma is compressed. As the plane moves from the coils toward the extraction system 22 the magnetic field intensity from the first magnetic field source 18 decreases, the plasma spreads out, and the magnetization of the plasma decreases.

The second magnetic field is pre-adjusted to optimize the efficiency of the plasma source to provide a uniform, and for beam extraction, an unmagnetized output. Different intensities of the second magnetic field can be designed. Different radial spacing (and thus number of permanent magnets—see FIG. 2) can be designed. For example, by decreasing the radial spacing the number of magnets at the periphery of chamber 14 would be increased. Also different longitudinal positioning between the first magnetic field source 18 and the extraction system 22 can be designed. In the preferred embodiment the permanent magnets 20 are movable at the periphery of the chamber 14 in a longitudinal direction following the axis of the chamber 14. Lastly, the magnetic pole configuration of the permanent magnets may vary. For the permanent magnet embodiment the design variables, thus, are magnetic field strength, radial spacing, longitudinal spacing and pole orientation.

In many etching and deposition applications it is desirable to generate a high energy ion beam, I, of the order 20–2000 electron-volts. As a result, the plasma generating chamber 14 operates at a high potential handling power inputs typically of the order of 500 to 1,000 Watts. A shield 26 is included to isolate the chamber 14 from the external environment at the periphery of the chamber 14.

The microwave source 12 is positioned at one end of the chamber 14 and does not need to operate at a high potential. By providing a voltage isolator between the Microwave source 12 and the chamber 14, the Microwave source 12 may be operated at or near ground potential while the plasma generating chamber 14 operates at a high potential.

Referring to FIGS. 1 and 8 the voltage isolator is a window apparatus made up of two barriers 40, 42. In the preferred embodiment the barriers are a choke flange 40 and a mating flange 42, although other types of barriers may be used. The choke flange 40 is in contact with the Microwave circuitry while the mating flange 42 is in contact the plasma generating chamber 14. The space between the two barriers 40, 42 is spanned by a nonconductive window 16 and bolts 56. The bolts 56 are arranged circumferentially around the window 16. The bolts are encased with an isolating material to preclude a current path from the mating flange 42 to the choke flange 40. The spacing between the barriers 40, 42 need only be enough to prevent a voltage jump between the mating flange 42 which is at a high potential and the choke flange 40 which is at or near ground potential. In the preferred embodiment the isolation is operable for approximately a 10,000 volt differential.

The window 16 is made of fused quartz, although other nonconductive materials transparent at microwave frequencies also may be used. Fused quartz has a dc conductivity at room temperature of $2 \times 10^{-17}$ (ohm-m)$^{-1}$. The dielectric constant of fused quartz at (10 w)/(2 pi)GHz is 3.78.

Because the ECR source 10 may be used with a high power Microwave beam and at high plasma chamber potentials the window 16 will absorb heat to such an extent that it may be a limiting factor on the energy level at which the ECR source 10 can operate. To avoid this problem the heat is transferred from the window 16 by conductive cooling. Water flows through the choke flange 40 in channel 44 and through the mating flange 42 in channel 46. By conductive heat transfer from window 16 to the flanges 40, 42, then to the water flowing through the channels 44, 46 the window 16 is cooled.

The window apparatus also is a pressure isolator which keeps the plasma generating chamber at a vacuum pressure of approximately $10^{-4}$ Torr while the microwave source 12 operates at or near atmospheric pressure. Vacuum seals 50 and 52 are provided to seal the plasma generating chamber 14 at the window 16. In the preferred embodiment, the seals 50 and 52 are metal annular rings which fit within the respective annular recesses of the flanges 40, 42. Metal is used so that the vacuum seals are compatible with the reactive gases used in the RIE, RIBE, CAIBE and RISE applications. Other compatible materials, however, may be used in these applications. Conventional rubber seals may be used in the nonreactive gas applications.

The window apparatus also includes a microwave choke for reducing the microwave leakage while entering the plasma generating chamber 14. The microwave choke is a conventional choke built into the choke flange 40.

FIG. 1 illustrates an Ion beam extraction configuration. The use of the word beam reflects the use of a grid set as the extraction system 22 to accelerate the ions. Such an embodiment is used for Chemically Assisted Reactive Ion Beam Etching (CAIBE) and Reactive Ion Beam Etching (RIBE).

Figure 7:
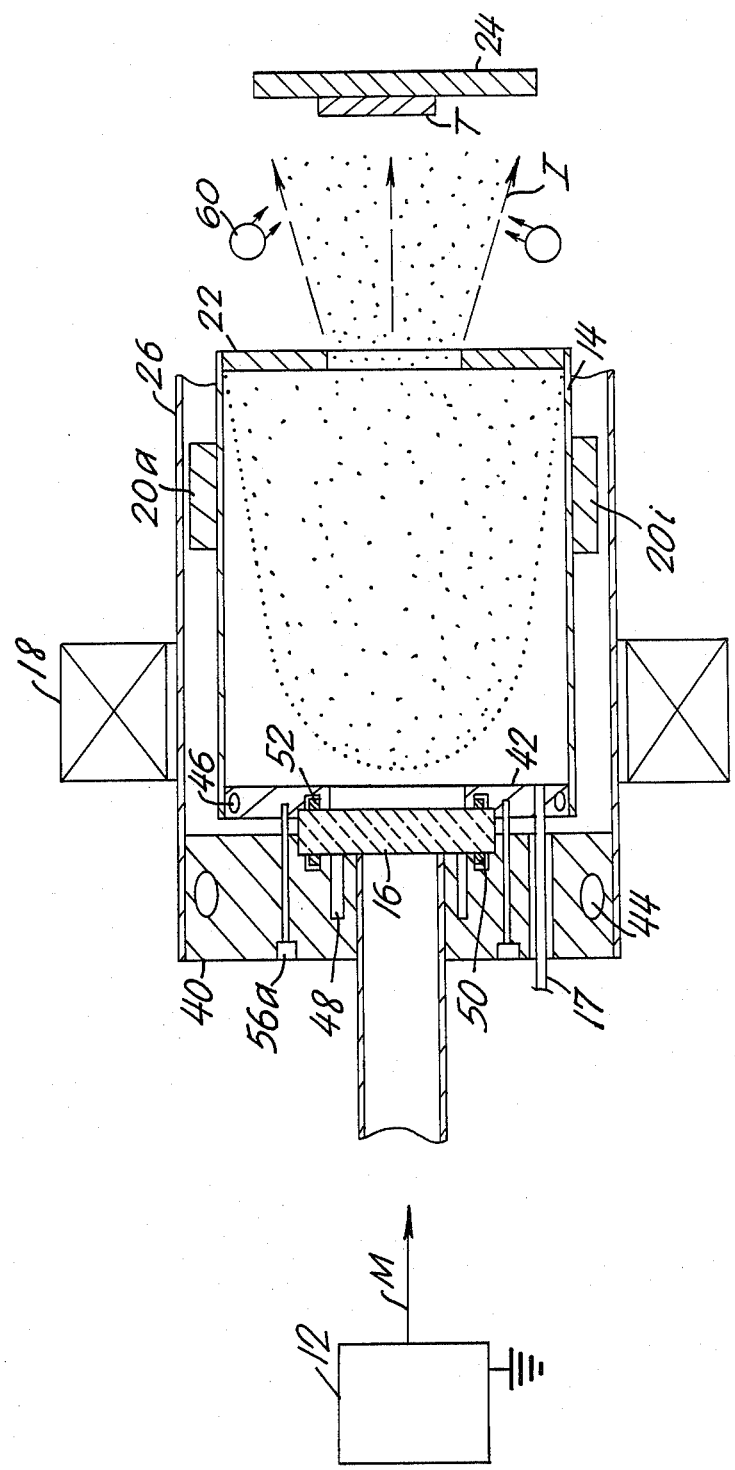
FIG. 7 is a cutaway view of the ECR plasma source configured as an ion stream source and showing the Microwave source in block diagram format.

FIG. 7 illustrates a plasma extraction configuration. The extraction system includes an orifice through which the plasma streams. A gas jet 60 is included for introducing gas into the target chamber. Such a configuration would be used for deposition processes and Reactive Ion Stream Etching (RISE), although other non beam applications might also be accomplished.

FIG. 8 illustrates an ion implantation configuration. The ions pass through optics 62 into a mass selection device 64. The ions are then accelerated by a accelerator 66 and pass through a scan device 68, before impacting the target, T.

While preferred embodiments of the invention have been illustrated and described, the invention is not intended to be limited to the exact embodiments illustrated. The scope of the invention is intended to be determined by reference to the claims and their equivalents interpreted in light of the prior art.

I claim:

1. An electron cyclotron resonance plasma source comprising:
    a plasma generating chamber into which gases are introduced and ionized into a plasma condition;
    a microwave source for applying microwave energy to the plasma generating chamber;
    a first magnetic field source outside the plasma generating chamber for generating a magnetic flux density in the plasma generating chamber which in combination with the microwave energy causes an electron cyclotron resonance condition in the plasma generating chamber and ionizes the gases into a plasma comprising ions, electrons, free radicals, and neutral atoms;
    an extraction system for extracting an output from the plasma generating chamber; and
    a second magnetic field source disposed at the periphery of the plasma generating chamber between the first magnetic field source and the extraction system, wherein the second magnetic field source is for enhancing the uniformity of the output.

2. The electron cyclotron resonance plasma source of claim 1, wherein the second magnetic field source provides a uniform field region within the plasma generating chamber to enhance the ion density uniformity of the plasma and the ion density uniformity of the output.

3. The electron cyclotron resonance plasma source of claim 1 wherein the second magnetic field is also for decreasing the magnetization of the plasma.

4. The electron cyclotron resonance plasma source of claim 1 wherein the second magnetic field source comprises permanent magnets radially aligned at the periphery of the plasma generating chamber between the first magnetic field source and the extraction system.

5. An electron cyclotron resonance plasma source comprising:
    a plasma generating chamber into which gases are introduced and ionized into a plasma condition;
    a microwave source for applying microwave energy to the plasma generating chamber;
    an electromagnetic coil outside the plasma generating chamber for generating a magnetic flux density in the plasma generating chamber which in combination with the microwave energy causes an electron cyclotron resonance condition in the plasma generating chamber and ionizes the gases into a plasma comprising ions, electrons, free radicals, and neutral atoms;
    an extraction system for extracting an output from the plasma generating chamber; and
    a plurality of permanent magnets disposed at the periphery of the plasma generating chamber between the electromagnetic coil and the extraction system, wherein the permanent magnets are for enhancing the uniformity of the output.

6. The electron cyclotron resonance plasma source of claim 5 wherein the plurality of permanent magnets are movable along a longitudinal axis of the plasma generating chamber between the electronmagnetic coil and the plasma extraction system.

7. The electron cyclotron resonance plasma source of claim 5, wherein the electromagnetic coil is movable along a longitudinal axis of the plasma generating chamber.

8. The electron cyclotron resonance plasma source of claim 5, wherein the plurality of permanent magnets also are for reducing the magnetization of the plasma.

9. The electron cyclotron resonance plasma source of claim 5, wherein the permanent magnets, in a plane of the plasma generating chamber defined by the permanent magnets, exert a minimal magnetic field intensity at the axis of the plasma generating chamber where the magnetic field intensity of the electromagnetic coil is strongest and a larger magnetic field intensity at the walls of the plasma generating chamber where the magnetic field intensity of the electromagnetic coil is reduced.

10. The electron cyclotron resonance plasma source of claim 9, wherein the difference in magnetic field intensity of the permanent magnets from the walls to the axis of the plasma generating chamber approximates the difference in magnetic field intensity of the electromagnetic coil from the axis to the walls of the plasma generating chamber.

11. An electron cyclotron resonance plasma source comprising:

a plasma generating chamber at a high potential into which gases are introduced and ionized into a plasma condition;

a microwave source at or near ground potential for applying microwave energy to the plasma generating chamber;

a means for electrically isolating the plasma generating chamber from the microwave source through which the microwave energy passes to enter the plasma generating chamber;

a magnetic field source outside the plasma generating chamber which in combination with the microwave energy causes an electron cyclotron resonance condition in the plasma generating chamber and ionizes the gases within the plasma generating chamber into a plasma comprising ions, electrons, free radicals, and neutral atoms; and an extraction system for extracting an output from the plasma generating chamber.

12. The electron cyclotron resonance plasma source of claim 11 wherein the means for electrically isolating comprises:

a first barrier in contact with the Microwave circuitry and having an area through which the Microwave energy passes;

a second barrier in contact with the plasma generating chamber and having an area through which the Microwave energy passes, and wherein the first and second barriers are electrically isolated from each other.

13. The electron cyclotron resonance plasma source of claim 12 wherein the first barrier and second barrier are spaced apart, wherein the areas through which Microwave energy passes are openings, and wherein the means for electrically isolating further comprises a nonconductive window between the first and second barriers at the openings of the first and second barriers.

14. The electron cyclotron resonance plasma source of claim 11 wherein the means for electrically isolating is water cooled.

15. An electron cyclotron resonance plasma source comprising:

a plasma generating chamber into which gases are introduced and ionized into a plasma condition;

a microwave source for applying microwave energy to the plasma generating chamber;

a water cooled window apparatus through which the microwave energy passes to enter the plasma generating chamber;

a magnetic field source outside the plasma generating chamber for creating a magnetic flux density in the plasma generating chamber which in combination with the microwave energy causes an electron cyclotron resonance condition in the plasma generating chamber and ionizes the gases within the plasma generating chamber into a plasma comprising ions, electrons, free radicals, and neutral atoms; and an extraction system for extracting an output from the plasma generating chamber.

16. The electron cyclotron resonance plasma source of claim 15, wherein the water cooled window apparatus electrically isolates the microwave source from the plasma generating chamber.

17. The electron cyclotron resonance plasma source of claim 15, wherein the water cooled window apparatus comprises;

a first water cooled barrier having an opening through which the microwave energy passes;

a second water cooled barrier having an opening through which the microwave energy passes;

a window between the first and second barriers at the openings of the first and second barriers, wherein the window is cooled by conduction from the first and second water cooled barriers.

18. The electron cyclotron resonance plasma source of claim 17, wherein the water cooled window apparatus further comprises a metal vacuum seal between at least one of the water cooled barriers and the window.

19. An electron cyclotron resonance plasma source comprising:

a plasma generating chamber at vacuum pressure to which gases are introduced and ionized into a plasma condition;

a microwave source at or near atmospheric pressure for applying Microwave energy to the plasma generating chamber;

a means for pressure isolating the plasma generating chamber from the microwave source and through which the microwave energy passes to enter the plasma generating chamber;

a magnetic field source outside the plasma generating chamber for creating a magnetic flux density in the plasma generating chamber which in combination with the microwave energy causes an electron cyclotron condition in the plasma generating chamber and ionizes the gases within the plasma generating chamber into a plasma comprising ions, electrons, free radicals, and neutral atoms; and an extraction system for extracting an output from the plasma generating chamber.

20. The electron cyclotron resonance plasma source of claim 19, wherein the means for pressure isolating comprises a window and a barrier between the plasma generating chamber and the microwave source, the barrier having an opening through which the microwave energy passes, the window positioned at the opening; the window apparatus further comprising a vacuum seal between the barrier and the window.

21. The electron cyclotron resonance plasma source of claim 20, wherein the vacuum seal is a metal vacuum seal compatible with reactive gases which may be introduced into the plasma generating chamber.

22. An electron cyclotron resonance plasma source comprising:

a high voltage plasma generating chamber at vacuum pressure into which gases are introduced and ionized into a plasma condition;

a grounded microwave source at or near atmospheric pressure for applying microwave energy to the plasma generating chamber;

a window apparatus for providing electrical and pressure isolation of the plasma generating chamber from the microwave source and through which the microwave energy passes to enter the plasma generating chamber;

a magnetic field source outside the plasma generating chamber for creating a magnetic flux density in the plasma generating chamber which in combination with the microwave energy causes an electron cyclotron resonance condition in the plasma generating chamber and ionizes the gases within the plasma generating chamber into a plasma comprising ions, electrons, and free radicals; and an extraction system for extracting an output from the plasma generating chamber;

the window apparatus comprising:

a first water cooled barrier in contact with the microwave circuitry having an opening through which the microwave energy passes and comprising a microwave choke;

a second water cooled barrier in contact with the plasma generating chamber having an opening through which the microwave energy passes, wherein the first and second water cooled barriers are electrically isolated;

a nonconductive window between the first and second barriers at the openings of the first and second barriers, wherein the window is cooled by conduction from the first and second water cooled barriers;

a first metal vacuum seal between the first barrier and the window; and a second metal vacuum seal between the second barrier and the window.

23. A method of producing a uniform ion density in the output of an ECR plasma source, comprising the steps of introducing a gas into a plasma generating chamber;

inducing cyclotron motion of electrons from the gas by a magnetic field of a first magnetic field source;

ionizing the gas into a plasma by introducing a microwave beam into the plasma generating chamber which in combination with the magnetic field results in an electron cyclotron resonance condition;

subjecting the plasma to a uniform magnetic field region within the plasma generating chamber to produce a uniform ion density of the plasma within the uniform magnetic field region; and outputting from the uniform plasma in the plasma generating chamber an output having a uniform ion density.

24. A method of producing a uniform ion beam output from an ECR plasma source, comprising the steps of:

introducing a gas into a plasma generating chamber;

inducing cyclotron motion of the electrons from the gas by a magnetic field of a first magnetic field source;

ionizing the gas into a plasma by introducing a microwave beam into the plasma generating chamber which in combination with the magnetic field results in an electron cyclotron resonance condition;

subjecting the plasma to a uniform reduced magnetic field region within the plasma generating chamber to produce a uniform ion density of the plasma at a reduced magnetization at an extraction system; and extracting a uniform ion beam from the uniform plasma at a reduced magnetization.

* * * * *